United States Patent
Gruenwald et al.

[11] Patent Number: 5,891,366
[45] Date of Patent: Apr. 6, 1999

[54] ANISOTROPICALLY CONDUCTING ADHESIVE, AND PROCESS FOR PRODUCING AN ANISOTROPICALLY CONDUCTING ADHESIVE

[75] Inventors: Werner Gruenwald, Gerlingen; Ralf Haug, Leonberg; Thomas Burkhart, Dahn; Martin Mennig, Fischbach; Helmut Schmidt, Saarbruecken; Monika Schneider, Neunkirchen, all of Germany

[73] Assignee: Robert Bosch GmbH, Stuttgart, Germany

[21] Appl. No.: 765,071
[22] PCT Filed: Jun. 16, 1995
[86] PCT No.: PCT/DE95/00769
  § 371 Date: Dec. 27, 1996
  § 102(e) Date: Dec. 27, 1996
[87] PCT Pub. No.: WO96/00969
  PCT Pub. Date: Jan. 11, 1996

[30] Foreign Application Priority Data

May 10, 1994 [DE] Germany .................. 195 17 062.8
Jun. 29, 1994 [DE] Germany .................. 44 22 712.4

[51] Int. Cl.$^6$ .............. H01B 1/22; B32B 31/26; B32B 31/28
[52] U.S. Cl. .................. 252/514; 252/512; 252/519.21; 156/73.1; 156/272.8; 156/273.9
[58] Field of Search .................. 252/512, 514, 252/519.21; 264/442, 446, 482, 494, 345; 156/73.1, 272.8, 273.9

[56] References Cited

U.S. PATENT DOCUMENTS

| | | | |
|---|---|---|---|
| 3,708,387 | 1/1973 | Turner et al. | 161/168 |
| 3,834,373 | 9/1974 | Sato | 252/514 |
| 4,735,847 | 4/1988 | Fujiwara et al. | 428/209 |
| 4,740,657 | 4/1988 | Tsukagoshi et al. | 174/88 R |
| 5,362,421 | 11/1994 | Kropp et al. | 252/512 |
| 5,670,251 | 9/1997 | Difrancesco | 428/325 |
| 5,685,939 | 11/1997 | Wolk et al. | 156/234 |

FOREIGN PATENT DOCUMENTS

| | | |
|---|---|---|
| 421709 | 4/1991 | European Pat. Off. |
| 2203442 | 10/1988 | United Kingdom |
| 93/01248 | 1/1993 | WIPO |

*Primary Examiner*—Mark Kopec
*Attorney, Agent, or Firm*—Venable; Norman N. Kunitz; Ashley J. Wells

[57] ABSTRACT

An anisotropically conducting adhesive includes a thermoplastic base material; and particles which include metal particles and metal ions, which are electrically conductive, and which are finely distributed within the thermoplastic base material below a percolation threshold, wherein the particles are enriched in certain regions under the influence of exposure to at least one of light and heat. A process for producing an anisotropically conducting adhesive includes providing a material comprised of thermoplastic base material in which electrically conductive particles including metal particles and metal ions are dispersed; and exposing the material to at least one of light and heat in predetermined regions in a targeted manner so that a targeted local heating occurs in the exposed regions and an increased mobility of the metal particles and metal ions occurs which is effective to provide a plurality of anisotropically electrically conductive paths having an enriched amount of the electrically conductive particles compared to that of adjacent regions, wherein the metal ions contribute to the formation of the plurality of anisotropically electrically conductive paths by undergoing reduction from the metal ion to the metal.

18 Claims, 2 Drawing Sheets

ANISOTROPICALLY CONDUCTING ADHESIVE, AND PROCESS FOR PRODUCING AN ANISOTROPICALLY CONDUCTING ADHESIVE

BACKGROUND OF THE INVENTION

1. Field of the Invention

The invention relates to an anisotropically conducting adhesive with particles dispersed in a thermoplastic base material and to a process for producing an anisotropically conducting adhesive.

2. Description of the Related Art

Anisotropically conducting adhesives are known. In a base material, for instance a thermoplastic base material, they have finely dispersed conductive particles. The conductive particles are dispersed in the form of particulate powder in the base material. The anisotropically conducting adhesives are in sheet form, for instance, and are suited for electrically conductively gluing together two contacts, for instance two conductor tracks. The tracks are pressed under pressure and temperature action onto the opposed sides of the adhesive, so that the base material deformed and the conductive particles distributed in it establish an electrically conductive connection between the applied tracks. The base material performs an adhesive action between the parts having the conductor tracks that are to be glued together.

It becomes clear that the resolution of the anisotropically conducting adhesive, that is, the minimum possible distance between two adjacent electrically conductive connections, depends on the structure of the dispersed electrically conductive particles. In order that the conductive particles will enable the electrically conductive connection in only one direction, they must be spaced apart sufficiently from one another so that an undesired isotropically electrically conductive connection is avoided. This can happen for instance from accidental coagulation, or in other words clumping together of the electrically conductive particles in the base material. As a result, the known anisotropically conducting adhesives can be used only for contacting contacts that are located relatively far apart from one another, because otherwise an adequately high contact reliability is not achieved.

SUMMARY OF THE INVENTION

The anisotropically conducting adhesive of the invention has particles dispersed in a thermoplastic base material, which particles are finely distributed below a percolation temperature, characterized in that the particles are metal particles and metal ions, and has the advantage over the prior art that by means of a purposeful coagulation of the electrically conductive particles, the contact reliability between two adjacent electrically conductive connections extending through the adhesive is improved. Because the conductive particles are formed by metal particles finally dispersed below a percolation threshold and dispersed metal ions, and these can be purposefully coagulated to form anisotropically electrically conductive paths, anisotropy of the contact connection is assured with high certainty. The term percolation threshold is understood to mean the state in which the conductive particles each occupy a random position in the base material, and in which there is just barely still no metallically conductive connection between two adjacent particles. Because of the coagulation of the conductive particles to form the electrically conductive paths, the adhesive has regions, advantageously between two adjacent conductive paths, of improved insulation capacity, since here the number of conductive particles is reduced as a result of the coagulation into the conductive paths.

As a result of the process according to the invention for producing the anisotropically conducting adhesive, it is highly advantageously possible in a simple way to employ process steps, known per se from the structuring of integrated circuits, in modified fashion. Because a thermoplastic base material with conductive particles dispersed in it is preferably exposed to light via a mask, causing local heating in the exposed regions of the base material, and anisotropically electrically conductive paths are created in the exposed regions, any arbitrary layout of anisotropically conductive paths can be created via a large process window, and very high resolution is possible.

In a preferred feature of the invention, it is provided that silver colloids and silver ions are incorporated in adequate quantity into the base material, or sufficient silver in a certain form is incorporated and then ions and colloids are created by suitable treatment. By means of a suitable reduction of the silver ions in the regions where the anisotropically conductive paths are to be created, it is possible, highly advantageously, to create electrically conductive regions with the silver, while the regions surrounding the electrically conductive regions are depleted of silver, so that the anisotropically conductive paths are attainable with very high resolution, or in other words with an extremely slight spacing from one another. It is preferably provided that the silver is partially or fully stabilized, preferably by means of formation of a complex, so that in the production of the anisotropically conductive paths spontaneous precipitation out of the silver does not occur, yet such precipitation can take place purposefully in reduced fashion in the region of the desired electrically conductive paths.

BRIEF DESCRIPTION OF THE DRAWINGS

Further advantageous features of the invention will become apparent from the other characteristics recited in the dependent claims.

The invention will be described in further detail below in exemplary embodiments, in conjunction with the associated drawings. Shown are.

DESCRIPTION OF THE PREFERRED EMBODIMENTS

Figure 1:
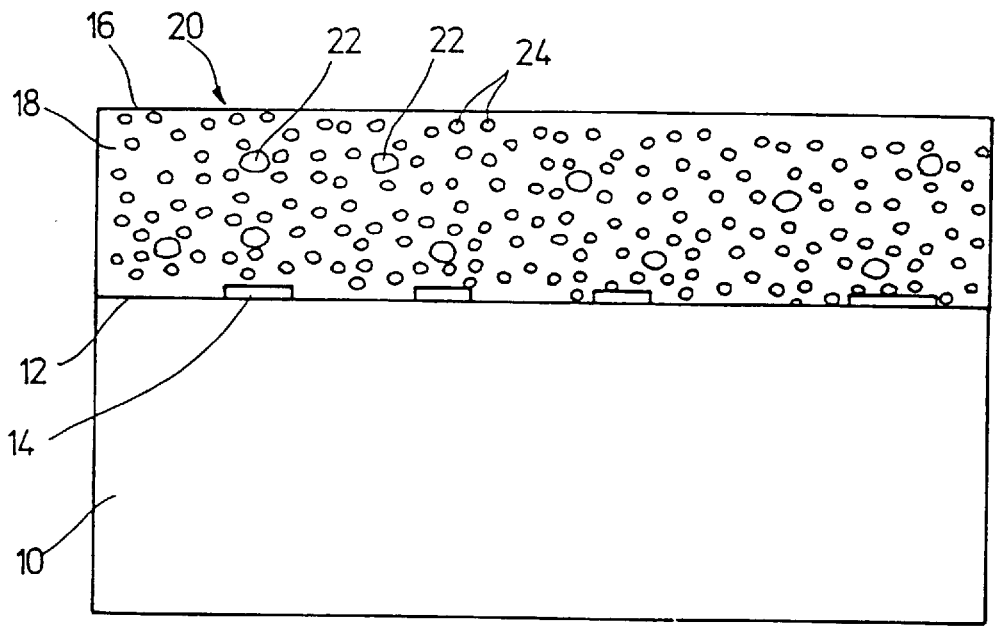
FIG. 1, a sectional view through an anisotropically conducting adhesive in the initiate state.

In FIG. 1, a substrate 10 is shown on whose surface 12 contact sites 14 are disposed. The substrate 10 may for instance be any arbitrary electronic component. The contact sites 14 form external terminals for components integrated on the substrate 10 or optionally in the substrate 10. The contact sites 14 may be formed by conductor tracks, contact paths, or other elements, for instance. In terms of the geometry of the contact sites 14, or in other words their geometrical length and geometrical shape, no special demands are made.

A layer 16 of a hot-melt adhesive is applied to the surface 12 of the substrate 10. The layer 16 may for instance be printed, rolled on, or applied in some other way to the substrate 10. The layer 16 has a thermoplastic base material 18, in which electrically conductive particles 20 are dispersed, or in other words finely distributed. The particles 20 comprise colloidal silver particles 22, on the one hand, which are distributed in the base material 18 below a possible percolation threshold. Silver ions 24 are also dispersed in the base material 18. The silver particles 22 and the silver ions 24 are dispersed in the base material 18 through the entire volume of the layer 16. The silver particles 22 have a diameter in a nanometer range. During the application of the layer 16, the contact sites 14 are surrounded at or on the substrate 10 by the base material 18.

Figure 2:
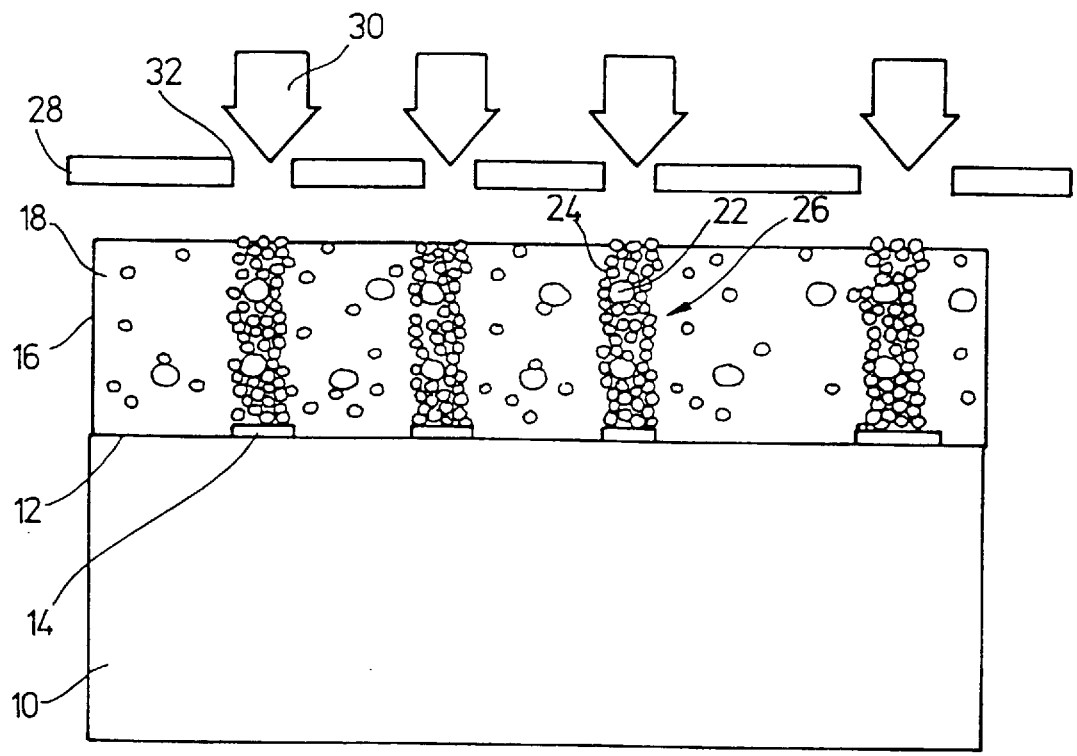
FIG. 2, a sectional view through an anisotropically conducting adhesive during a forming operation.

FIG. 2 illustrates the structuring of anisotropically conductive paths 26 through the layer 16. To that end, the layer 16 is exposed to UV light 30 via a mask 28. The mask 28 has openings 32 for this purpose, whose layout preferably corresponds to the contact sites 14 to be contacted in the substrate 10. The UV light 30 thus passes through the openings 32 of the mask 28 to strike the regions of the layer 16 that cover the contact sites 14. Within the exposed regions, the UV light 30 is absorbed by the silver particles 22, which thus heat up. The heating of the silver particles 22 causes local heating in the base material 18, so that in these regions the base material 18 becomes fluid. Within the fluid regions thus created, the silver ions 24 become mobile. The silver particles 22 form condensation nuclei for the silver ions 24, so that the silver ions 24 are attracted by the silver particles 22 and are deposited onto them. The continuing deposition of silver ions 24 causes the condensation nuclei to grow into the anisotropically conductive paths 26. Because of the resultant concentration gradients of the silver ions 24, even farther-away silver ions 24 are also attracted to the resultant centers of silver particles 22 with the silver ions 24 growing around them, so that the final result is the electrically conductive paths 26. The degree of concentration of silver particles 22 or silver ions 24 forming the electrically conductive paths 26 can be adjusted via the duration or the intensity of the UV light 30. Because of the accumulation of silver ions 24 at electrically conductive paths 26, these ions are simultaneously thinned out in the regions of the base material 18 located between two adjacent electrically conductive paths, so that a good insulation ratio exists between the adjacent paths 26. Once the UV light 30 is turned off and the mask 28 is removed, the base material 18 cools down, so that the liquefied regions harden, and thus the conductive paths 26 formed remain in their positions.

A further advantageous example for attaining anisotropically conductive paths in an adhesive will be described below. To the extent that appeared useful for comprehension, reference numerals of FIGS. 1 and 2 were used again, although here the production process proceeds differently.

First, the base material 18 is synthesized. To that end, 200 ml of 100% purified ethanol is heated to boiling while stirring. A mixture of 69.63 g (=27.5 mol %) dichlorodiphenylsilane, 98.75 g (=70 mol %) dichloromethylvinylsilane and 5.20 g (=2.5 mol %) tetraethoxysilane is slowly added drop by drop. After this addition has been completed, the mixture is boiled in reflux for 2 h; the HCl gas liberated in the reaction escapes via the reflux cooler and is carried through a hose into a container with water. The reaction mixture takes on a slightly yellow color during the reaction. By distilling the solvent off in a water jet vacuum (30 mbar) at 70° C., a slightly viscous liquid is obtained. This precondensate is then repeatedly received in 200 ml of ethanol and reconcentrated at 70° C. and 30 mbar until it exhibits a neutral reaction with respect to the pH value. To the clear yellowish solution that remains, the same quantity by volume of acetone is added, and the solution is heated to boiling and then quickly mixed with 73.8 ml of 0.1 normal aqueous hydrochloric acid (=4.0 mols of water). The solution is then boiled in reflux for 3 h, whereupon the condensate settling out causes a white cloudiness. After the solvent is extracted in a water jet vacuum at 70° C., a hydrolyzate is obtained, which is then dissolved twice in the same quantity of acetone and each time is again concentrated at 30 mbar and 30° C. The viscous, milky residue that remains is then heated in a water jet vacuum at 180° C. until such time as the following extinction conditions between the OH bands at 3620 cm$^{-1}$ and 3400 cm$^{-1}$ and the phenyl-CH bands at 3070 cm$^{-1}$ result in the IR spectrum of the specimen:

$$E_{3620}/E_{3070}=0.358\pm0.03$$

and $$E_{3400}/E_{3070}=0.624\pm0.06.$$

The result obtained is an Ormocer resin on the basis of diphenyldichlorosilane, methylvinyldichlorosilane, and tetraethoxysilane.

The thus-obtained matrix of the base material 18 is then synthesized into the complete adhesive system having the conductive particles 20. To that end, 2.3633 g of the previously synthesized Ormocer resin are aminofunctionalized with 0.0128 g (0.00529 mol) of AMDES (aminopropylmethyldiethoxysilane) for 30 minutes at 140° C. and then cooled down to 100° C. Next, 2.9107 g (0.0174 mol) of silver acetate are dissolved in 5 ml of acetone and mixed with 2.8958 g (0.0173 mol) of DIAMO. This silver salt solution is added to the aminofunctionalized Ormocer resin, and the mixture is stirred for 5 to 10 minutes at 100° C., until the viscosity increases sharply. Then, 0.0257 g (0.0105 epoxy resin equivalent) with Gy266 (produced by Araldit) are added drop by drop, having previously been dissolved in 1.5195 g of acetone. Now at 100° C. while stirring, the reaction is maintained until the desired viscosity, which is determined by the "B-stage" test, is attained.

After the conclusion of the reaction, a base material 18 is obtained that is filled with approximately 30% silver in proportion by mass. The base material 18, provided with the silver as conductive particles 20, can now be applied in the layer 16 to a substrate 10. The layer thickness is 10 $\mu$m, for instance. The application of the layer 16 can be done by conventional, well-known methods, such as blade coating.

Next, the layer 16 is subjected to a laser treatment. To that end, an argon ion laser with a laser spot diameter of 60 $\mu$m, operated in the VIS range and the multiline mode, for instance, is used. The laser power can be varied depending on the type of anisotropically electrically conductive paths 26 to be made. If conductor tracks are to be made, for instance, the power may be ⅓ W. The laser is passed over the layer 16 by the so-called "direct laser writing" method. The substrate 10, along with the layer 16, can be moved past the laser spot. To that end, the substrate 10 is disposed on a suitable X table, for instance. The advancement speed is 0.5 mm/sec, for instance. In accordance with the intended motion of the substrate 10, a conductor track is purposefully structured in the layer 16 in those regions where the laser treatment takes place. During the laser treatment, a purposeful or in other words local heating of the layer 16 occurs, in which the stabilization of the silver is undone. This causes thermal destruction of silver complexes, for instance. The consequence is increased mobility of the silver ions in certain regions. At the center of the interaction, silver accumulates and is reduced purposefully. This creates a diffusion sink for the silver ions. The regions with silver in the center grow to form the electrically conductive paths 26, while around these regions a depletion of silver ions occurs.

The purposeful reduction of the silver is promoted by products of decomposition of the base material 16 arising during the local heating of the base material 16, or is reinforced by complexing agents of the stabilized silver. These agents act as reducing agents for the reduction of the silver.

In another example, the laser spot of the laser can be focused at a specific site of the layer 16. This selected site is irradiated for a certain period of time, such as 10 seconds, with the laser power being 1 W, for instance. As a consequence of the irradiation for the selected length of time, what is created at this site is a silver pitch, or in other words a single, defined electrically conductive path 26. The same chemical processes proceed within the layer 16 that lead to the purposeful reduction of the silver in the irradiated region, so that silver colloids are created that establish the electrically conductive connection. In the unirradiated regions, the silver remains stable, so that an isotropic conductivity is precluded by the distribution of the silver in the base material 16 below the percolation threshold. Moreover, the silver ions in the immediate vicinity of the silver pitch created are depleted, so that the anisotropy of the conductivity is thereby improved.

Overall, it becomes clear that by suitable complexing of the base material 18, a very high degree of filling with silver can be attained. In the example shown, a mass proportion of 30% has been mentioned, but it can also be substantially higher, for instance 70%. By means of the synthesis of the base material 18, precipitation out of the silver is prevented. At the same time, during the complexing, substances can be incorporated that enable or promote the ensuing reduction of the silver under the influence of an exposure to light and/or a laser treatment.

Figure 3:
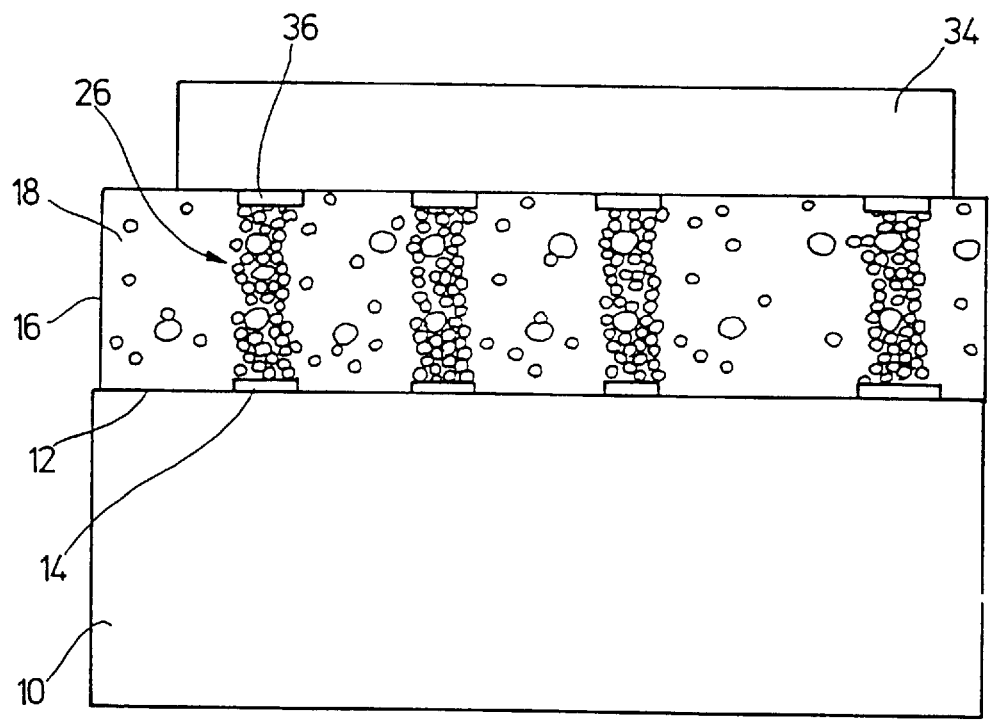
FIG. 3, a sectional view through an anisotropically conducting adhesive in the contacted state.

From FIG. 3, a connection by means of the hot-melt adhesive layer 16 is illustrated; it may be produced on the basis of the UV exposure and/or the laser treatment. Identical elements to those of FIGS. 1 and 2 are provided with the same reference numerals and not explained again below.

In the example shown, the substrate 10 is glued to a further substrate 34 via the hot-melt adhesive layer 16. The substrate 34 is likewise chosen merely as an example and may for instance be a chip that integrated electronic components. The substrate 34 has contact sites 36, which are meant to be electrically conductively connected to the contact sites 14 of the substrate 10. The substrate 34 is positioned above the substrate 10, with its contact sites 36 oriented in the direction of the hot-melt adhesive layer 16. The positioning is done such that the contact sites 14 and 36 to be contacted face one another. Since the connection grid of substrates 10 and 34 to be conducted is known per se, it is assured via the layout of the mass 28 that an electrically conductive path 26 is present between each of the contact sites 14 and 36 to be contacted. The substrates 10 and 34 are now joined together by heating of the hot-melt adhesive layer 16. This heating softens the base material 18, and the heating temperature is adjustable depending on the material of the base material 18. If the base material 18 is siloxane-based, for instance, the substrates 10 and 34 may for instance be glued together at a temperature of about 120° C. The softened base material 18 then takes on the task of large-area adhesion promotion between the substrates 10 and 34, while the electrically conductive connection is effected via the contact sites 14, the paths 26 and the contact sites 36. The resultant composite system is then heat-treated, so that the hot-melt adhesive layer 16 is cured. This can take place for instance at a temperature of about 120° C., over a relatively long period of time, or at a higher temperature in a shorter period of time. The curing temperature may be chosen as a function of the temperature resistance of the substrates 10 and 34.

With the anisotropically conducting adhesive of the invention, a system is created that can be processed and manipulated easily. Especially because conductive particles are extended out of the regions between two conductive paths 26, the anisotropy of the hot-melt adhesive layer 16 is substantially improved. The resultant conductive paths 26 are distinguished by improved electrical conductivity and current-carrying capacity, compared with known anisotropic adhesives. The conductive paths 6 may be structured at arbitrary sites of a large-area existing hot-melt adhesive layer 18, so that in a simple technical process, any arbitrary configuration of an electrically conductive connection between two substrates can be realized. Moreover, with the anisotropically conducting adhesive of the invention, heavy-duty connections between the substrates 10 and 34 to be glued together can be made. As a result of the full-surface mechanical fixation of the substrates 10 and 34 over the base material 18, the electrically conductive connections are subject to only slight mechanical strain, thus improving the contact reliability of the entire arrangement. Any strains that might occur can be absorbed by the elasticity of the base material 18, so that different thermal expansions on the part of the substrate 10 or the substrate 34, for instance, can be compensated for without worsening the contact reliability.

We claim:

1. An anisotropically conducting adhesive, comprising:
   a thermoplastic base material; and
   particles which include metal particles and metal ions, which are electrically conductive, and which are finely distributed within the thermoplastic base material below a percolation threshold,
   wherein the particles are enriched in certain regions under the influence of exposure to at least one of light and heat.

2. The anisotropically conducting adhesive of claim 1, wherein the metal particles are colloidal silver particles and wherein the metal ions are silver ions.

3. The anisotropically conducting adhesive of claim 2, wherein the colloidal silver particles have a particle size in the nm range.

4. The anisotropically conducting adhesive of claim 2, wherein the colloidal silver particles are agglomerated and have a particle size ranging from 5 to 50 $\mu$m.

5. A process for producing an anisotropically conducting adhesive, comprising:
   providing a material comprised of thermoplastic base material in which electrically conductive particles including metal particles and metal ions are dispersed; and
   exposing the material to at least one of light and heat in predetermined regions in a targeted manner so that a targeted local heating occurs in the exposed regions and an increased mobility of the metal particles and metal ions occurs which is effective to provide a plurality of anisotropically electrically conductive paths having an enriched amount of the electrically conductive particles compared to that of adjacent regions,
   wherein the metal ions contribute to the formation of the plurality of anisotropically electrically conductive paths by undergoing reduction from the metal ion to the metal.

6. The process of claim 5, wherein the metal particles are colloidal metal particles.

7. The process of claim 6, wherein the colloidal metal particles are colloidal silver particles, and wherein the metal ions are silver ions.

8. The process of claim 5, wherein the metal particles which are dispersed in the thermoplastic base material are converted into colloidal metal particles by exposure to at least one of light and heat.

9. The process of claim 8, wherein the colloidal metal particles are colloidal silver particles, and wherein the metal ions are silver ions.

10. The process of claim 5, wherein reduction of the metal ions from metal ion to metal is performed purposefully in the respective regions in which the plurality of anisotropically electrically conductive paths are created.

11. The process of claim 10, wherein reduction of the metal ions from metal ion to metal is performed purposefully by at least one of (a) including in the material a reducing agent effective for the reduction of the metal ions, (b) creating a reducing agent effective for the reduction of the metal ions by decomposing the material to provide a decomposition product which is said reducing agent effective for the reduction of the metal ions, and (c) creating a reducing agent effective for the reduction of the metal ions by including a complexing agent in the material and by decomposing the complexing agent to provide a decomposition product which is said reducing agent effective for the reduction of the metal ions.

12. The process of claim 5, wherein the reduction from the metal ion to the metal is performed by means of localized treatment with a laser.

13. The process of claim 5, wherein the electrically conductive particles are one of partially stabilized or fully stabilized by including in the material an agent effective to stabilize the electrically conductive particles.

14. The process of claim 5, wherein the material is exposed to light through a mask having defined therein openings arranged in a predetermined layout.

15. The process of claim 5, wherein the material is exposed to light, and wherein the light is absorbed by the metal particles.

16. The process of claim 5, wherein the metal ions are colloidal metal ions, wherein the material is exposed to light, and wherein the light is absorbed by the colloidal metal ions.

17. The process of claim 5, wherein the material is exposed to light, and wherein the light is UV light.

18. The process of claim 5, wherein the plurality of anisotropically electrically conductive paths having an enriched amount of the electrically conductive particles compared to that of adjacent regions has a degree of enrichment, and wherein the degree of enrichment is adjustable by varying duration or intensity of exposure to the at least one of light and heat.

* * * * *